US008470918B2

(12) United States Patent
Hirose et al.

(10) Patent No.: US 8,470,918 B2
(45) Date of Patent: Jun. 25, 2013

(54) EPOXY RESIN COMPOSITION AND SEMICONDUCTOR DEVICE

(75) Inventors: Hiroshi Hirose, Tokyo (JP); Hideaki Sasajima, Tokyo (JP); Hitoshi Kawaguchi, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 469 days.

(21) Appl. No.: 12/088,053

(22) PCT Filed: Sep. 27, 2006

(86) PCT No.: PCT/JP2006/319816
§ 371 (c)(1),
(2), (4) Date: Jan. 23, 2009

(87) PCT Pub. No.: WO2007/037500
PCT Pub. Date: Apr. 5, 2007

(65) Prior Publication Data
US 2009/0215943 A1 Aug. 27, 2009

(30) Foreign Application Priority Data

Sep. 30, 2005 (JP) .................. 2005-287981
Dec. 28, 2005 (JP) .................. 2005-379313
Jan. 5, 2006 (JP) .................. 2006-000953

(51) Int. Cl.
*C08K 3/38* (2006.01)
*C08L 63/00* (2006.01)

(52) U.S. Cl.
USPC ............................ 524/405; 524/612; 524/406

(58) Field of Classification Search
USPC .... 528/87, 421, 407, 405, 406, 418; 524/494, 524/405, 406, 612
See application file for complete search history.

(56) References Cited

U.S. PATENT DOCUMENTS

| | | | |
|---|---|---|---|
| 7,074,738 B2 | 7/2006 | Okubo et al. | |
| 7,442,729 B2 | 10/2008 | Okubo et al. | |
| 7,655,871 B2 * | 2/2010 | Arai et al. | 174/258 |
| 2003/0152777 A1 * | 8/2003 | Osada et al. | 428/413 |
| 2004/0039154 A1 * | 2/2004 | Okubo et al. | 528/408 |
| 2005/0049133 A1 * | 3/2005 | Fujiwara et al. | 501/70 |
| 2006/0258822 A1 | 11/2006 | Okubo et al. | |

FOREIGN PATENT DOCUMENTS

| | | |
|---|---|---|
| CN | 1594425 | 3/2005 |
| JP | 07-205144 | 8/1995 |
| JP | 11-140276 | 5/1999 |
| JP | 2001-210759 | 8/2001 |
| JP | 2001-302767 | 10/2001 |
| JP | 2001302764 A * | 10/2001 |
| JP | 2002-37863 | 2/2002 |
| JP | 2003-002949 | 1/2003 |
| JP | 2003-26764 | 1/2003 |
| JP | 2004-27062 | 1/2004 |
| JP | 2004-182851 | 7/2004 |
| JP | 2004182851 A * | 7/2004 |
| JP | 2004-277750 | 10/2004 |
| JP | 2004-300431 | 10/2004 |
| JP | 2004277750 A * | 10/2004 |
| JP | 2004300431 * | 10/2004 |
| JP | 2004-359853 | 12/2004 |
| JP | 2005-82690 | 3/2005 |
| JP | 2005082690 A * | 3/2005 |

OTHER PUBLICATIONS

Machine language translation of JP 2001302764.*
Machine language translation of JP 2004182851.*
Machine language translation of JP 2004300431.*
Machine language translation of JP 2005082690.*
Office Action issued by the Chinese Patent Office for the patent application No. 200680036367.2 which is corresponding to the present application.
Japanese Office Action for corresponding JP Application No. 2007-537766, Oct. 23, 2012.

* cited by examiner

*Primary Examiner* — Robert D. Harlan
(74) *Attorney, Agent, or Firm* — Ditthavong Mori & Steiner, P.C.

(57) ABSTRACT

There are provided an epoxy resin composition exhibiting less warpage after molding and during a solder treatment process as well as during a low temperature process of, for example, a temperature cycle test, and excellent in flame retardancy, solder crack resistance, and flowability; and a semiconductor device using the same. The epoxy resin composition used in the semiconductor device contains at least one type of epoxy resin (A) selected from a trifunctional epoxy resin and a tetrafunctional epoxy resin, a curing agent (B) having at least two hydroxyl groups per molecule, a compound (C) having at least two cyanate groups per molecule, and an inorganic filler (D), as essential components.

21 Claims, No Drawings

EPOXY RESIN COMPOSITION AND SEMICONDUCTOR DEVICE

TECHNICAL FIELD

The present invention relates to an epoxy resin composition and a semiconductor device, in particular, to an epoxy resin composition suitably used in an area-mounted semiconductor device and the semiconductor device.

BACKGROUND ART

Recently, high performance electronic equipment reduced in size and weight has been desired in the market. With this tendency, the packaging density of a semiconductor device has increased year by year. On the other hand, surface packaging of a semiconductor device has been accelerated. In the circumstances, an area-mounted semiconductor device has been newly developed and a semiconductor device has been just shifted from the conventional structure toward this type. An area-mounted semiconductor device is represented by a ball grid array semiconductor device (hereinafter referred to as "BGA") and a chip size package semiconductor device (hereinafter referred to as "CSP") further reduced in size. These structures have been developed so as to satisfy the requirements for increasing the number of pins and high speed operation, which have been no longer satisfied by conventional surface-mounted semiconductor devices such as QFP and SOP. The area-mounted semiconductor device has a structure formed by mounting a semiconductor element on one of the surfaces of a circuit board, which is typically formed of a bismaleimide-triazine (hereinafter referred to as "BT") resin/copper foil, and molding/sealing the surface having the semiconductor element mounted thereon, that is, only one of the surfaces of the substrate, with an epoxy resin composition. Since a resin sealed layer of several-hundreds μm to several mm in thickness is formed on the surface having a semiconductor element mounted thereon, one of the surfaces is substantially sealed. Therefore, an organic substrate is likely affected by misalignment between a metal substrate and a cured product of an epoxy resin composition due to thermal expansion/thermal shrinkage, or affected by shrinkage taking place when an epoxy resin composition is molded/cured, with the result that the organic substrate used in these semiconductor devices is likely to warp immediately after molding. A semiconductor device is exposed to a temperature of 230° C. to 260° C. during a connecting process with solder, whereas it is sometimes exposed to a temperature of −55° C., for example, during a temperature cycle test. At this time, when the amount of warpage increases, wiring will break, causing conduction failure or a crack will generate in the resin portion. When the crack grows, wiring may break. Studies of reducing warpage have been made by many researchers. For example, warpage produced by cooling a substrate to normal temperature after molding is reduced by using a triphenyl based epoxy or a naphthalene based multifunctional epoxy whose glass transition temperature has been set at not less than a molding temperature (see, for example, Japanese Patent Application Laid-Open No. 2002-37863). However, when the substrate is exposed to an atmosphere of 260° C., in consideration of a later step in which the temperature of the substrate is increased to a reflow temperature, warpage increases. Furthermore, usually a flame retardant such as aluminum hydroxide is added to ensure flame retardancy; however, addition of the flame retardant may increase warpage particularly at 260° C. depending upon the type of flame retardant.

Warpage increases particularly at 260° C. This is because the glass transition temperature (hereinafter referred to as "Tg") is low. To explain more specifically, since value of the linear expansion coefficient (hereinafter referred to as "α2") of a resin increases at a temperature of Tg or more, the difference in linear expansion coefficient between the substrate and the resin increases, increasing warpage of the semiconductor device. Thus, it has been desired to urgently develop a novel semiconductor sealing epoxy resin composition having a higher Tg while maintaining low water absorption, having low value of α2 at a temperature of Tg or more, excellent in solder crack resistance and flowability while maintaining flame retardancy, and exhibiting less warpage at a temperature from −55° C. to 260° C.

The present invention provides an epoxy resin composition for use in an area-mounted semiconductor device exhibiting less warpage after molding and during a solder treatment process as well as during a low temperature process of, for example, a temperature cycle test, and excellent in flame retardancy, solder crack resistance and flowability, and provides a semiconductor device using the same. The present invention further provides an epoxy resin composition excellent in curing ability and a semiconductor device using the same.

DISCLOSURE OF THE INVENTION

According to a first aspect of the invention to attain the aforementioned object, there is provided an epoxy resin composition characterized by comprising at least one type of epoxy resin (A) selected from a trifunctional epoxy resin and a tetrafunctional epoxy resin, a curing agent (B) having at least two groups capable of reacting with epoxy groups per molecule, a compound (C) having at least two cyanate groups per molecule, and an inorganic filler (D), as essential components.

In the first aspect, the trifunctional epoxy resin can be represented by the following formula (1):

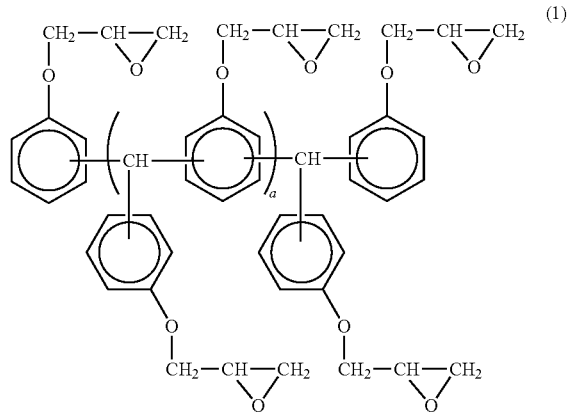

where, a represents 0 to 10.

In the first aspect, the tetrafunctional epoxy resin can be represented by the following formula (2):

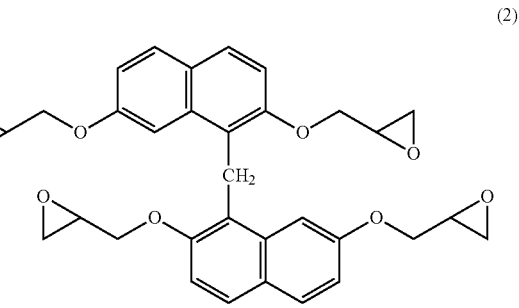

In the first aspect, the compound (C) having at least two cyanate groups per molecule can be represented by the following general formula (3):

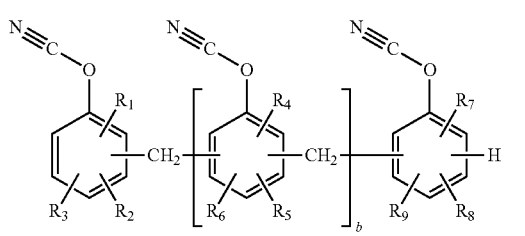

where, $R_1$ to $R_9$ each represent one type of element selected from a hydrogen atom, a methyl group, an ethyl group, a propyl group, a butyl group, a hydroxyl group, an amino group, phthalic acid, phthalic anhydride and a phenyl group and may be the same or different to each other; and b represents 0 to 10.

In the first aspect, the inorganic filler (D) can be crystalline silica and/or glass flakes.

In the first aspect, the glass flakes can have an aspect ratio of 10 to 40.

In the first aspect, the curing agent (B) having at least two hydroxyl groups per molecule can be represented by the following formulas (4), (5) and/or (6):

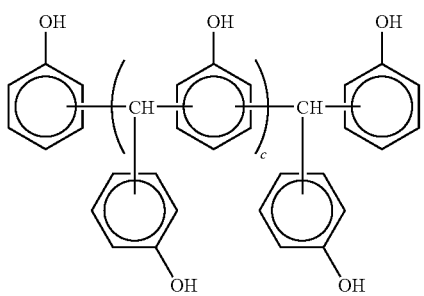

where, c is 0 to 10.

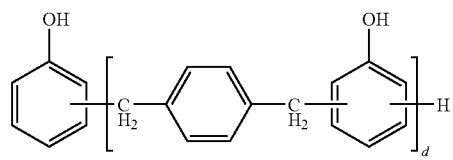

where d is 1 to 10.

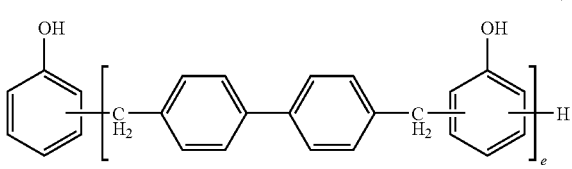

where e is 1 to 10.

In the first aspect, the content of the inorganic filler (D) can be 65 wt % to 85 wt % of the epoxy resin composition.

In the first aspect, a compound (E) having at least two benzoxazine rings can be further comprised.

In the first aspect, the compound (E) having at least two benzoxazine rings can have at least two carbon-carbon triple bonds per molecule.

In the first aspect, at least one type of compound selected from zinc molybdate and zinc borate can be further comprised as a flame retardant (F).

In the first aspect, the content of the inorganic filler (D) and the flame retardant (F) can be 65 wt % to 85 wt % of the epoxy resin composition.

In the first aspect, a flame retardant (F) can be further comprised.

In the first aspect, the flame retardant (F) can be at least one type of compound selected from zinc molybdate and zinc borate.

In the first aspect, the content of the inorganic filler (D) and the flame retardant (F) can be 65 wt % to 85 wt % of the epoxy resin composition.

In the first aspect, a curing accelerator (H) having at least one type of compound selected from a compound having a phenolic hydroxyl group, a metal complex and a metal oxide can be further comprised.

In the first aspect, the compound having a phenolic hydroxyl group can be bisphenol A, bisphenol F or bisphenol S.

In the first aspect, the metal atom of the metal complex and the metal oxide can be Mn, Fe, Co, Ni, Cu, Zn, Al or Sn.

In the first aspect, the metal complex can be a naphthenic acid complex, an octylic acid complex, an acetylacetonato complex or a cyclopentadienyl complex.

In the first aspect, the value of the linear expansion coefficient $\alpha 2$ of the epoxy resin composition at a temperature of a glass transition temperature or more can be not more than 2 fold as large as the value of the linear expansion coefficient $\alpha 1$ at a temperature of less than the glass transition temperature.

In the first aspect, a curing accelerator (H) represented by the following general formula (7) can be further comprised.

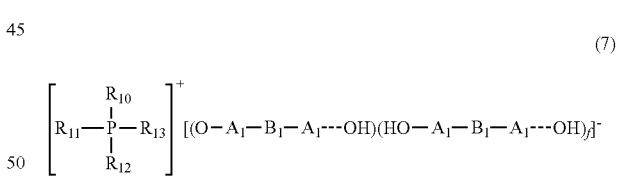

where P represents a phosphorus atom; $R_{10}$, $R_{11}$ $R_{12}$ and $R_{13}$ may be a substituted or unsubstituted aromatic group or an alkyl group; $A_1$ is an aromatic group, $B_1$ is a single bond or a divalent substituent selected from an ether group, sulfone group, sulfide group and carbonyl group, or a divalent organic group having 1 to 13 carbon atoms; and f is 0<f<1.

According to a second aspect of the invention to attain the aforementioned object, there is provided an area-mounted semiconductor device having a substrate having the surfaces one of which a semiconductor element is mounted and only the one of which is substantially sealed with an epoxy resin composition, characterized in that the epoxy resin composition is the aforementioned epoxy resin composition and further cured at 190° C. to 230° C. after the area-mounted semiconductor device is molded.

BEST MODE FOR CARRYING OUT THE INVENTION

The present invention is directed to providing an epoxy resin composition comprising at least one type of epoxy resin (A) selected from a trifunctional epoxy resin and a tetrafunctional epoxy resin, a curing agent (B) having at least two groups capable of reacting with epoxy groups per molecule, a compound (C) having at least two cyanate groups per molecule, and an inorganic filler (D), as essential components and exhibiting less warpage after an area-mounted semiconductor device is molded by use of the epoxy resin composition and during a solder treatment process or excellent in view of warpage during a low temperature process presumably exposed in a thermal shock test.

An epoxy resin composition according to the first embodiment will now be described in detail below.

Examples of the at least one type of epoxy resin (A) selected from a trifunctional epoxy resin and a tetrafunctional epoxy resin generally include a monomer, oligomer and polymer having at least 2 trifunctional or tetrafunctional epoxy groups. The molecular weight and structure thereof are not particularly limited. Specific examples thereof may include bisphenol type epoxy resins such as a bisphenol A type epoxy resin, and bisphenol F type epoxy resin; epoxy resins, which are produced by reacting epichlorohydrin with the hydroxyl group of a phenolic compound such as phenols, a phenolic resin and naphthols, and whose examples include a biphenyl type epoxy resin, biphenyl aralkyl type epoxy resin, stilbene type epoxy resin, phenol novolac type epoxy resin, cresol novolac type epoxy resin, naphthalene type epoxy resin, triphenol methane type epoxy resin, terpene modified phenol type epoxy resin, hydroquinone type epoxy resin, dicyclopentadiene type epoxy resin and dihydroxybenzene type epoxy resin; alicyclic epoxy resins epoxidized by oxidation of an olefin with a peracid; glycidyl-ester type epoxy resins; and glycidyl-amine type epoxy resins. These may be used singly or in combination with two or more types.

Of them, as the epoxy resin (A), an epoxy resin primarily containing either one of a trifunctional epoxy resin represented by the aforementioned formula (1) and a naphthalene type tetrafunctional epoxy resin represented by the aforementioned formula (2) or two or more types thereof can be used. These resins each have a high glass transition temperature and a small value of a linear expansion coefficient (hereinafter referred to as "α2") at a temperature of not less than the glass transition temperature. When the glass transition temperature is low, the warpage of the semiconductor device increased when the semiconductor device is exposed to a temperature higher than the glass transition temperature. For this reason, a resin having as high a glass transition temperature as possible can be used. Furthermore, when the value of α2 is low, the amount of warpage is low even at a temperature higher than the glass transition temperature.

The trifunctional epoxy resin to be selected as the epoxy resin (A) is not limited to the epoxy resins represented by the formula (1). The epoxy resin having a naphthalene skeleton contributing to flame retardancy between functional groups, as represented by the formula (8) below is included as the trifunctional epoxy resin that can be used as the epoxy resin (A). Furthermore, when a tetrafunctional epoxy resin represented by the formula (2) is selected as the epoxy resin (A), this epoxy resin can be used singly or in combination with other epoxy resin(s), as the epoxy resin (A). To describe more specifically, an epoxy resin containing an epoxy resin represented by the formula (2) in an amount of 5 to 20%, an epoxy resin represented by the following formula (17) in an amount of 40 to 60%, and an epoxy resin represented by the following formula (18) in an amount of 30 to 50% can be also used as the epoxy resin (A).

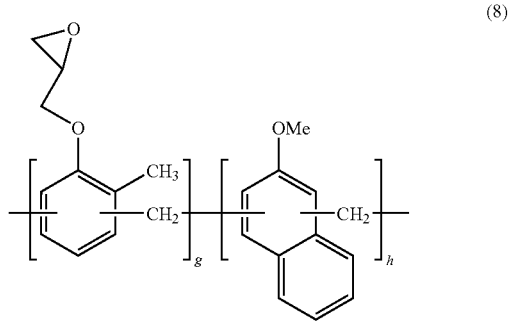

(8)

where g and h represent degree of polymerization and the copolymerization ratio of g:h (wt %) is 50:50 to 80:20.

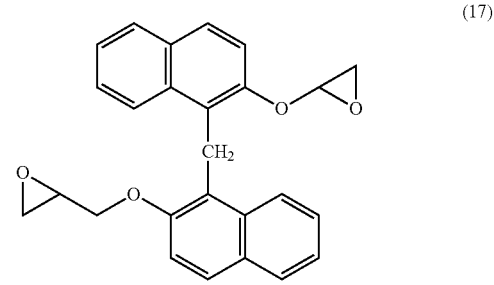

(17)

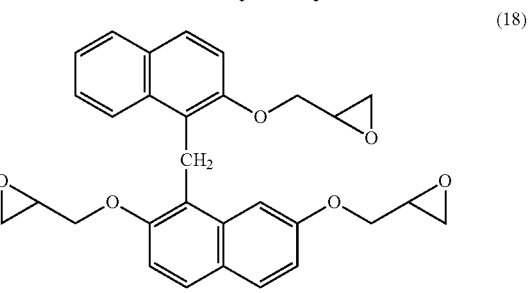

(18)

Furthermore, k in the formula (13) represents the average repeat number of epoxy resin units. Reference symbol k can be about 2 to 10 and particularly 1 to 5. Reference symbol a in the formula (1) represents the average repeat number of epoxy resin units and can be 0 to 10. An epoxy resin composition prepared such that the reference symbols k and a satisfy the aforementioned ranges is more improved in flowability.

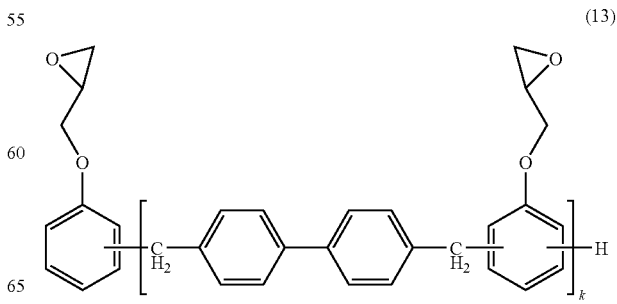

(13)

The curing agent (B) having at least two groups capable of reacting with epoxy groups per molecule to be used in this embodiment functions as a curing agent of the epoxy resin (A). Any compound may be used as long as it contains at least two phenolic hydroxyl groups and amino groups per molecule. However, a halogenated compound is eliminated.

Examples of the curing agent (B) may include a phenol novolac resin, cresol novolac resin, bisphenol resin, phenolaralkyl resin, biphenyl-aralkyl resin, triphenol-methane type phenolic resin, xylylene modified novolac resin, terpene modified novolac resin, dicyclopentadiene modified phenolic resin, diaminobenzine, diaminonaphthalene, diaminofluorene and pararosaniline (base). These may be used singly or in combination with two or more types.

Of them, in view of reducing warpage of a semiconductor device while maintaining flame retardancy, particularly, a phenolic resin represented by the formula (4), pararosaniline (base) represented by the formula (14), a phenolaralkyl resin represented by the formula (5), and a biphenylaralkyl resin represented by the formula (6) can be used singly or in combination with two types or more, as the curing agent (B). When other resins are used, flame retardancy decreases and the value of α2 increases, with the result that warpage suppression effect may decrease.

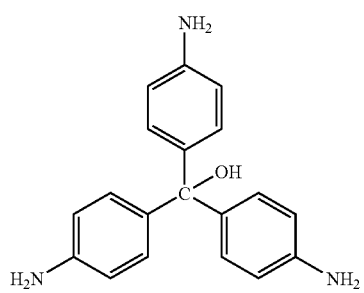

(14)

Reference symbol c of the formula (4) represents the average repeat number of phenolic resin units and can be 0 to 10. Furthermore, reference symbol d of the formula (5) and reference symbol e of the formula (6) each represent the average repeat number of phenolic resin units and both can be about 1 to 10 and particularly can be about 1 to 5. In an epoxy resin prepared such that reference symbols c, d, and e satisfy the aforementioned ranges, a decrease of flowability can be suitably prevented or suppressed.

The compound (C) having at least two cyanate groups per molecule to be used in this embodiment is not particularly limited as long as it contains at least two cyanate groups; however, it can be obtained, for example, by reacting a halogenated cyan compound with phenols having at least two phenolic hydroxyl groups. Specific examples thereof may include bisphenol type cyanate resins such as bisphenol A type cyanate resin, bisphenol E type cyanate resin and tetramethyl bisphenol F type cyanate resin; and novolac type cyanate resins. Of them, to reduce the value of α2, a novolac type cyanate resin can be used.

As the novolac type cyanate resin, a compound represented by the following general formula (3) below can be mentioned.

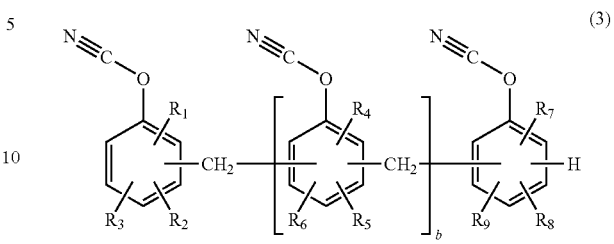

(3)

where $R_1$ to $R_9$ each represent one type of group selected from a hydrogen atom, a methyl group, an ethyl group, a propyl group, a butyl group, a hydroxyl group, an amino group, phthalic acid, phthalic anhydride and a phenyl group and these may be the same or different; and b represents 0 to 10.

As these substituents $R_1$ to $R_9$ each represent a hydrogen atom, a methyl group, an ethyl group, a propyl group, a butyl group, a hydroxyl group, an amino group, phthalic acid, phthalic anhydride and a phenyl group. Of them, a hydrogen atom and a methyl group can be used in particular. This reduces the value of α2 at a temperature of a glass transition temperature and the warpage of the semiconductor device.

The inorganic filler (D) to be used in the embodiment may not be particularly limited. For example, molten silica, crystalline silica, talc, alumina and silicon nitride may be mentioned. Spherical molten silica can be most suitably used. These inorganic fillers may be used singly or in combination with two or more types. Furthermore, an inorganic filler having an aspect ratio of 10 to 40, for example, glass flakes, when it is used in a semiconductor device, provides a large warpage suppression effect and satisfactory flame retardancy. These may be used singly or in combination with two or more types. Examples of the inorganic fillers having an aspect ratio of 10 to 40 may include glass flakes, glass fiber, mica and clay minerals such as clay.

The aspect ratio is defined as a value obtained by dividing an average particle diameter by an average thickness: average particle diameter/average thickness.

The content of the inorganic filler (D) can be 65 wt % to 85 wt % of the epoxy resin composition. When the content is less than 65% and more than 85 wt %, the warpage increases.

Furthermore, an average particle diameter of crystalline silica can be 1 μm to 70 μm. When crystalline silica having an average particle diameter of more than 70 μm, the flowability significantly too low to mold. In contrast, when the average particle diameter is less than 1 μm, the viscosity of the resin melted increases and flowability significantly decreases.

Furthermore, particularly, the average particle diameter can be 50 μm or less.

The epoxy resin composition is molded and left at a high temperature equal to more than a molding temperature for several hours to allow it completely cured. At this time, satisfactory conditions can be a temperature of 175° C. or more for 2 hours or more, particularly a temperature of 190° C. to 230° C. for 4 hours to 12 hours. When the processing temperature increases, the glass transition temperature can be further increased. However, when the resin is left alone at a temperature of 230° C. or more for 12 hours or more, the glass transition temperature may not be further increased.

In the embodiment, a curing accelerator can be used in addition. The curing accelerator is not particularly limited as long as it can accelerate the crosslinking reaction between an epoxy resin and a phenolic resin. Examples of the curing accelerator may include, but no limited to, a diazabicycloalkene and a derivative thereof such as 1,8-diazabicyclo(5,4,0)

undecene-7, an organic phosphorus based compound such as triphenylphosphine, tetraphenylphosphonium tetraphenylborate, and an imidazole compound such as 2-methylimidazole. These may be used singly or in a mixture thereof. Catalysts such as cobalt acetylacetonato and cobalt naphthenate, which accelerates the reaction between a cyanate resin and an epoxy resin may be used in combination. The catalysts may not be limited to these.

In the embodiment, a curing accelerator (H), which is an assembly of molecules between tetra substituted phosphonium and a phenolic compound, represented by the aforementioned general formula (7) may be used. The curing accelerator (H) is composed of a single tetra-substituted phosphonium cation and an anionic unit formed of 1 or more and less than 3 of phenolic hydroxyl groups and a single phenoxide anion. The curing accelerator (H) conceivably has a stable structure since a positively charged tetra substituted phosphonium ion is surrounded by 1 or more and less than 3 of phenolic hydroxyl groups and a single phenoxide anion.

As the phosphonium ion that may have such a structure, a tetra substituted phosphonium ion having a substituted or unsubstituted aryl group or alkyl group as a substituent can be used since it is stable to heat and hydrolysis. Examples of $R_{10}$ to $R_{13}$ may include various types of isomers of a benzyl group, methyl group, ethyl group, n-butyl group, n-octyl group, cyclohexyl group, naphthyl group, p-tertiary phenyl group, 2,6-dimethoxyphenyl group, phenyl group, and methylphenyl group; various types of isomers of a methoxyphenyl group; and various types of isomers of a hydroxyphenyl group. Examples of the tetra-substituted phosphonium cation may include a tetra-aryl substituted phosphonium such as tetraphenylphosphonium and tetratolylphosphonium; a triarylmonoalkylphosphonium, which is synthesized from a triarylphosphine such as triphenylmethylphosphonium and an alkyl halide; and a tetra-alkyl substituted phosphonium such as tetrabutylphosphonium.

Furthermore, $A_1$ contained in a phenolic hydroxyl group and a phenoxide anion forming the curing accelerator (H) has an aromatic group such as phenyl, naphthalene, or anthraquinone; $B_1$ has a methyl group, ethyl group, propyl group, ether group, sulfone group, sulfide group, or carbonyl group. Examples of a phenolic compound represented by $A_1$-$B_1$-$A_1$ include bisphenols such as bisphenol A (2,2-bis(4-hydroxyphenyl)propane), bisphenol F (4,4'-methylene bisphenol, 2,4'-methylene bisphenol, 2,2'-methylene bisphenol), bis(4-hydroxyphenyl)sulfone (bisphenol S), bisphenol E (4,4'-ethylidenebisphenol), bisphenolfluorene (4,4'-(9H-fluoren-9-ylidene)bisphenol), 4,4'-methylidenebis(2,6-dimethylphenol) and bis(4-hydroxyphenyl)methanone; 4,4'-bisphenol, 2,2'-bisphenol; 3,3',5,5'-tetramethyl bisphenol; and 2,2-bis(4-hydroxyphenyl). In view of stability and curing ability of a molecular compound, physical properties of a cured product, bisphenol A, bisphenol F (including 4,4'-methylene bisphenol, 2,4'-methylene bisphenol and 2,2'-methylene bisphenol, as well as their isomer mixture such as bisphenol F-D manufactured by Honshu Chemical Industry Co., Ltd.), bisphenol S, 4,4'-biphenol and 2,2-bis(4-hydroxyphenyl) can be used.

The curing accelerator (H) can be synthesized by a method comprising the steps of dissolving a phenolic compound as mentioned above and a base that finally assists dehalogenation, for example, an alkaline metal hydroxide such as sodium hydroxide and potassium hydroxide or an organic base such as pyridine or triethylamine, in a solvent such as an alcohol, subsequently adding a halide of a tetra-substituted phosphonium as mentioned above dissolved in an appropriate solvent and allowing them to react, and finally recovering as solid matter by an operation such as recrystallization or reprecipitation, or alternatively by a method of subjecting tetra-substituted phosphonium tetra-substituted borate and a phenolic compound to a thermal reaction and thereafter subjecting to heat reaction performed in a solvent such as an alcohol.

The curing accelerator (H) has the aforementioned structure of a phosphonium-phenoxide type salt, which differs from that of a compound having a conventional phosphonium-organic acid anion salt. In the curing accelerator (H), the higher order structure of a phenolic hydroxyl group associated with a hydrogen bond involving a proton surrounds the ionic bonding. In a conventional salt, the reactivity is controlled only by the strength of the ionic bonding, whereas, in the curing accelerator (H), a reaction active center is protected at normal temperature since the ion pair of the active center is surrounded by the higher order structure. In an actual molding step; however, the higher order structure collapses to expose the active center, which initiates a reaction. In other words, so-called latent reactivity is imparted. Because of the latent reactivity, good flowability and sufficient curing ability can be compatible.

Furthermore in the embodiment, if necessary, a flame retardant (F) such as zinc molybdate and zinc borate, a coupling agent, a mold-release agent such as natural wax or synthetic wax, a colorant such as carbon black may be appropriately blended.

An epoxy resin composition is prepared by blending individual components, kneading the mixture while heating by a heating kneader or a heating roller, cooling and pulverizing it.

A semiconductor device may be manufactured by sealing a semiconductor element by use of an epoxy resin composition according to the embodiment and curing the epoxy resin composition by a conventional molding method such as transfer mold, compression mold or injection mold.

An epoxy resin composition according to a second embodiment of the invention will now be described in detail below.

It should be noted that the components included in the epoxy resin composition is the same as that in the first embodiment, and therefore, explanations thereof will be omitted.

The flame retardant (F) to be used in this embodiment, which can be at least one type of compound selected from zinc molybdate (F-1) and zinc borate (F-2), has flame retardancy and produces an effect of suppressing warpage at a high temperature (particularly, a glass transition temperature or more). The larger the particle diameter of zinc molybdate (F-1) and zinc borate (F-2), the lower the flame retardancy. The average particle diameter can be 1 μm to 70 μm, and particularly, 5 μm to 50 μm.

The content of the inorganic filler (D), zinc molybdate (F-1) and zinc borate (F-2) can be 65 wt % to 85 wt % of the epoxy resin composition. In both cases where the content is less than 65 wt % and more than 85 wt %, the warpage increases.

After the epoxy resin composition is molded, a molded product is left alone at a temperature as high as the molding temperature or more for several hours to cure it completely. The conditions at this time can be a temperature of 175° C. or more and a period of time of 2 hours or more, particularly, 190° C. to 230° C. and 4 to 12 hours. The glass transition temperature may be further increased by increasing a processing temperature. Even if a molded product is left alone at a temperature of 230° C. or more for 12 hours or more, the glass transition temperature may not be increased.

An epoxy resin composition according to this embodiment may further contain a curing accelerator (G), if necessary.

Examples of the curing accelerator (G) can include at least one type of compound selected from a compound having a phenolic hydroxyl group, a metal complex and metal oxide. Specific examples thereof may include phenols such as phenol, bisphenol A, bisphenol F, bisphenol S, nonylphenol and phenol novolac; metal complexes and metal oxides containing a metal atom such as Mn, Fe, Co, Ni, Cu, Zn, Al or Sn. Of them, an Al complex, Co complex, Sn complex or Fe complex can be used. In particular, metal complexes such as zinc naphthenate, cobalt naphthenate, tin octylate, cobalt octylate, bis-acetylacetonato cobalt (II), tri-acetylacetonato cobalt (III), ferrocene, and cobalt acetylacetonato; and metal oxides such as aluminum oxide can be used. The content of the curing accelerator (G) may be appropriately chosen depending upon the curing ability. These catalysts may be used in combination of two or more types. Of them, a combination of bisphenol S and an Al complex and a combination of bisphenol S and a Co complex can be used.

Furthermore, the aforementioned curing accelerator can be used also in this embodiment. Any curing accelerator can be used as long as it accelerates the crosslinking reaction between an epoxy resin and a cyanate. Examples thereof may include, but no limited to, a diazabicycloalkene and a derivative thereof such as 1,8-diazabicyclo(5,4,0)undecene-7 and an imidazole compound such as 2-methylimidazole. These may be used singly or in a mixture thereof.

Furthermore in the embodiment, if necessary, a coupling agent, a mold-release agent such as natural wax or synthetic wax, and a colorant such as carbon black may be appropriately blended.

An epoxy resin composition according to a third embodiment of the invention will now be described in detail below.

It should be noted that the components included in the epoxy resin composition is the same as that in the first and the second embodiments, and therefore, explanations thereof will be omitted.

A compound (E) having at least two benzoxazine rings to be used in the invention can be obtained by reacting an amine compound, a compound having a phenolic hydroxyl group, and formaldehydes in the presence or absence of a solvent. Examples of the amino compound may include aniline, methylamine, ethylamine, n-propylamine, i-propylamine, cyclohexylamine, toluidine, aminonaphthalene, aminoanthracene, ethynylaniline, ethynylaminonaphthalene, ethynylaminoanthracene, aminophenyl propargyl ether, aminonaphthalene propargyl and aminoanthracene propargyl ether. Compounds such as ethynylaniline, ethynylaminonaphthalene, ethynylaminoanthracene, aminophenyl propargyl ether, aminonaphthalene propargyl and aminoanthracene propargyl ether are primary amine compounds having at least one substituent containing a carbon-carbon triple bond.

Examples of the compound having a phenolic hydroxyl group may include bisphenol A, bisphenol F, bisphenol S, 4,4'-(1-methylpropylidene)bisphenol, 4,4'-(1,3'-dimethylbutylidene)bisphenol, 4,4'-(2-ethylhexylidene)bisphenol, 4,4'-methylidenebisphenol, 4'-[1,4-phenylenebis(1-methylethylidene)]bisphenol, 4,4'-cyclopentylidene bisphenol, 4,4'-cyclohexylidene bisphenol, 4,4'-(1-phenylethylidene) bisphenol, 4,4'-dihydroxybiphenyl; a novolac type phenolic resin; a hydrocarbon modified phenolic resin, triphenylmethane, 4,4'-dihydroxybenzophenone, 2,4'-dihydroxybenzophenone, 2,4,4'-trishydroxybenzophenone, 2,2',4,4'-tetrahydroxybenzophenone, monohydroxynaphthalene, dihydroxynaphthalene, dihydroxybenzene, and trishydroxybenzene.

Examples of the formaldehydes may include formalin, which is an aqueous formaldehyde solution, and a polymer, such as paraformaldehyde, acetaldehyde and benzaldehyde.

Examples of the solvent may include methylethylketone, toluene, 1-propanol, 2-propanol, 1-butanol, 1,4-dioxane, ethylene glycol monomethyl ether, ethylene glycol monoethyl ether and ethylene glycol monobutyl ether. These solvents may be used singly or in a mixture.

Examples of the compound (E) having at least two benzoxazine rings obtained from these can include compounds obtained by using, as an amine compound, aniline, aminonaphthalene, aminoanthracene, m-ethynylaniline, p-ethynylaniline, ethynylaminonaphthalene or ethynylaminoanthracene, as a compound having a phenolic hydroxyl group, 1,4-dihydroxybenzene (hydroquinone), 1,3,5-trishydroxybenzene, dihydroxynaphthalene, 4,4'-dihydroxybiphenyl, 4,4'-dihydroxybenzophenone, bisphenol A, bisphenol F, bisphenol S or triphenylmethane, and as formaldehydes, formalin or paraformaldehyde.

The compound (E) having at least two benzoxazine rings to be used in the invention can be obtained by reacting an amine compound (1 mol) and formaldehydes (2 moles) with a phenolic hydroxyl group (1 mole) of a compound having a phenolic hydroxyl group, distilling away a solvent after completion of the reaction when the solvent is used, treating with an alkaline wash, if necessary, and removing unreacted components.

Further in the embodiment, if necessary, a flame retardant (such as brominated epoxy resin and antimony oxide) other than zinc molybdate and zinc borate, a coupling agent, a mold-release agent such as natural wax or synthetic wax, a colorant such as carbon black may be appropriately blended.

EXAMPLES

Examples of an epoxy resin composition according to the first embodiment of the invention will now be described in detail below. However, the embodiment will not be limited to these. The units of contents are expressed in terms of parts by weight.

Example 1-1

The following components were prepared:

as the epoxy resin, a biphenyl type epoxy resin (A-1) (YX 4000H manufactured by Japan Epoxy Resin Co., Ltd., melting point: 105° C., epoxy equivalent: 193) primarily containing a compound represented by the following formula (12);

as the curing agent, a curing agent (B-1) primarily containing a component represented by the formula (4) (MEH7500 manufactured by Meiwa Plastic Industries, Ltd., softening point: 110° C., hydroxyl group equivalent: 97, note that the number c of repeat units is 0);

as the compound having at least two cyanate groups per molecule, a novolac type cyanate resin (C-1) represented by the following formula (9) (CT-90 manufactured Lonza Group Ltd., melting point: 65° C., note that the number i of repeat units is 3 in average);

as the inorganic filler, crystalline silica (D-1) (average particle diameter: 42 μm, the content of particles having a diameter of 30 μm to 60 μm: 90.4 wt %);

as a curing accelerator 1, imidazole (2 MPZ manufactured by Shikoku Chemicals Corporation);

as a curing accelerator 2, cobalt acetylacetonato (manufactured by Kanto Chemical Co. Inc.);

as other additives, a mold-releasing agent: carnauba wax (Nikko Carnauba (trade name) manufactured by Nikko Fine Product Co.), a coloring agent: carbon black (Carbon #5 (trade name) manufactured by Mitsubishi Chemical Corporation), and a coupling agent (GPS-M manufactured by Chisso Corp.).

These components were blended in accordance with the contents shown below:

| | |
|---|---|
| Biphenyl type epoxy resin (A-1) | 9.0 parts by weight |
| Curing agent (B-1) | 4.5 parts by weight |
| Novolac type cyanate resin (C-1) | 5.8 parts by weight |

(9)

[Chemical structure of novolac type cyanate resin with N≡C-O groups attached to methylphenyl units linked by CH₂ bridges, with subscript i]

(12)

[Chemical structure of biphenyl type epoxy resin with two epoxy groups connected via ether linkages to a tetramethylbiphenyl core]

| | |
|---|---|
| Crystalline silica (D-1) | 80.0 parts by weight |
| Curing accelerator 1 (imidazole) | 0.15 parts by weight |
| Curing accelerator 2 (cobalt acetylacetonato) | 0.15 parts by weight |
| Mold-releasing agent (Carnauba wax) | 0.2 parts by weight |
| Coloring agent (Carbon black) | 0.1 parts by weight |
| Coupling agent (GPS-M) | 0.1 parts by weight |

Note that, the average particle diameter of crystalline silica (D-1) used herein was obtained by use of a laser diffraction type particle-size distribution measurement apparatus, SALD-7000 (laser wavelength: 405 nm) manufactured by Shimadzu Corporation.

The aforementioned components were blended at normal temperature by a mixer, kneaded by a heating roller at 70° C. to 120° C., cooled and then pulverized to obtain an epoxy resin composition. The epoxy resin composition thus obtained was evaluated by the following method. The evaluation results are shown in Table 1.

Evaluation Methods

1. Spiral flow: Using a mold for spiral flow measurement in accordance with EMMI-1-66, measurement was performed in the conditions: mold temperature: 175° C., transfer pressure: 6.9 MPa, curing time: 2 minutes. The unit used herein was centimeter.

2. Linear expansion coefficient α1 (linear expansion coefficient at 50° C. to 70° C.), α2 (linear expansion coefficient at 230° C. to 250° C.): The epoxy resin composition was molded by a low pressure transfer molding machine at a mold temperature of 175° C. and at a transfer pressure of 7.4×10⁶ Pa, for curing time of 120 seconds to obtain test pieces. The test pieces were subjected to a post curing process in which heating was performed at 175° C. for 4 hours. The values of the coefficients α1 and α2 were determined by a thermomechanical analyzer (TMA-120 manufactured by Seiko Electronic Components Co., Ltd., temperature raising rate: 5° C./min.).

3. Measurement of glass transition temperature (Tg): The epoxy resin composition was molded by a low pressure transfer molding machine at a mold temperature of 175° C. and a transfer pressure of 7.4×10⁶ Pa, for curing time of 120 seconds to obtain test pieces (2 mm width×30 mm length×1.0 mm thickness). The test pieces were subjected to a post curing process in which heating was performed at 175° C. for 4 hours. The test pieces were distorted by applying a frequency of 10 Hz while the temperature of the test pieces were raised at a rate of 5° C./min. and dynamic viscoelasticity was measured by a dynamic mechanical spectroscope apparatus (DMS6100 manufactured by Seiko instruments Inc.). Based on the peak value of tan δ, the glass transition temperature (Tg) was determined.

4. Package warpage amount: On a circuit board (Two sided board of ELC-4785GS core of 43×43 mm in size manufactured by Sumitomo Bakelite Co., Ltd.), a silicon chip (size: 15×15 mm, thickness: 0.73 mm) was mounted. This construct was filled with underfill (CRP-4152, manufactured by Sumitomo Bakelite Co., Ltd). The epoxy resin composition was molded by a transfer molding machine at a mold temperature of 180° C. and a transfer pressure of 7.4 MPa, for curing time of 2 minutes to obtain a package (package size: 43×43 mm). The package was subjected to a post curing processes in which heating was performed at 175° C. for 4 hours and 200° C. for 4 hours. After cooling the package to room temperature, the amount of warpage was determined by a warpage measuring apparatus of a shadow moiré system (PS-200 manufactured by Acrometrix) as displacement in the height direction. The highest difference in displacement was defined as the amount of warpage. Measurement was performed at 4 temperatures of −55° C., 25° C., 150° C. and 260° C. At each measurement temperature, the case where the amount of the warpage is 200 μm or less is indicated by ⊚, the case where the amount of the warpage is 400 μm or less is indicated by ○, the case where the amount of the warpage is 600 μm or less is indicated by Δ, and the case where the amount of the warpage is 800 μm or less is indicated by x.

5. Solder crack resistance: 8 packages, which were molded and subjected to a post curing process (performed at 175° C. for 4 hours) for the package warpage amount measurement, were treated at 60° C., a relative humidity of 60%, for 168 hours in accordance with JEDEC level 3, and then subjected to an IR reflow treatment performed at a peak temperature 235° C. of the JEDEC conditions. After the treatment, the presence or absence of removal and crack within each of the packages was observed by an ultrasonic flaw detector. The number of defective packages were counted. The ratio of defective packages n to 8 packages was indicated as n/8.

6. Thermal Shock Test

The same packages (10 packages) as used in the solder crack resistance test were dried at 125° C. for 24 hours and left alone in a vessel maintained at a constant temperature of 60° C. and a constant humidity (relative humidity) of 60% for 40 hours in accordance with JEDEC level 3. Thereafter, the 10 packages were put into an IR reflow furnace (in N₂ flow) three times and then loaded in an apparatus (THERMAL SHOCK CHAMBER TSA-101S manufactured by ESPEC corp.) in which a vessel of −55° C. is instantly replaced with a vessel of 125° C.). Packages were treated in a vessel of 125° C. for 30 minutes and then −55° C. for 30 minutes. This cycle was repeated 1000 times. After that, removal and crack within each of the packages were observed by an ultrasonic flaw detector. The ratio of defective packages n to 10 packages was indicated as n/10.

7. Flame Resistance

The epoxy resin composition was molded by a transfer molding machine under the conditions: a mold temperature of 175° C. and a transfer pressure of 6.86 MPa (70 kgf/cm²) for curing time of 120 seconds to obtain test pieces. The test pieces were subjected to a post curing process in which heating was performed at 175° C. for 4 hours, thus flame resistance test samples are produced. Using the flame resistance test samples of 3.0 mm in thickness, ΣF and Fmax were determined in accordance with UL94 standard. In this manner, V-0, V-1, V-2, and non-standard were determined.

Examples 1-2 to 1-7

The components except those used in Example 1-1 were as follows:

As the epoxy resin, a biphenyl aralkyl type epoxy resin (A-2) primarily containing a compound represented by the aforementioned formula (13) (NC-3000P manufactured by Nippon Kayaku Co., Ltd., softening point: 60° C., epoxy equivalent: 272), an epoxy resin (A-3) primarily containing a compound represented by the aforementioned formula (1) (E-1032H60 manufactured by Japan Epoxy Resin Co., Ltd., a melting point: 56° C., epoxy equivalent: 171, note that the number a of repeat units is 0), an epoxy resin (A-4) (HP4770 manufactured by Dainippon Ink and Chemicals, Inc., epoxy equivalent: 205) containing a naphthalene type tetrafunctional epoxy resin represented by the aforementioned formula (2), or naphthalene novolac type epoxy resin (A-5) (ESN-375 manufactured by Nippon Steel Chemical Co., Ltd., epoxy equivalent: 173) represented by the formula (10) below;

as the curing agent, a curing agent (B-2) primarily containing a component represented by the formula (14) (pararosaniline (base) manufactured by Kanto Chemical Co. Inc., $NH_2$ equivalent: 101), a phenol aralkyl resin (B-3) primarily containing a compound represented by the formula (5) (XL-225 manufactured by Mitsui Chemicals, Inc., hydroxyl group equivalent: 172, softening point: 77° C., note that the number d of repeat units is 3 in average), or a biphenyl aralkyl type phenolic resin (B-4) primarily containing a compound represented by the formula (6) (MEH-7851ss manufactured by Meiwa Plastic Industries, Ltd., hydroxyl group equivalent: 199, softening point: 68° C., note that the number e of repeat units is 3 in average);

as the compound having at least two cyanate groups per molecule, a cyanate resin (C-2) represented by the formula (11) below (PT-60 manufactured by Lonza Group Ltd., note that the number j of repeat units is 3 in average);

as the inorganic filler, glass flakes (D-2) (RCF140A manufactured by Nippon Sheet Glass Company, Limited, aspect ratio: 28, average particle diameter: 45 μm), microwool (D-3), which consists of glass fiber, (CMLF109 manufactured by Nippon Sheet Glass Company, Limited, aspect ratio: 35, average particle diameter: 70 μm), or spherical molten silica (D-4) (average particle diameter: 15 μm).

The components were blended in accordance with the contents shown in Table 1 and kneaded in the same manner as in Example 1-1 to prepare epoxy resin compositions, which were subjected to evaluation.

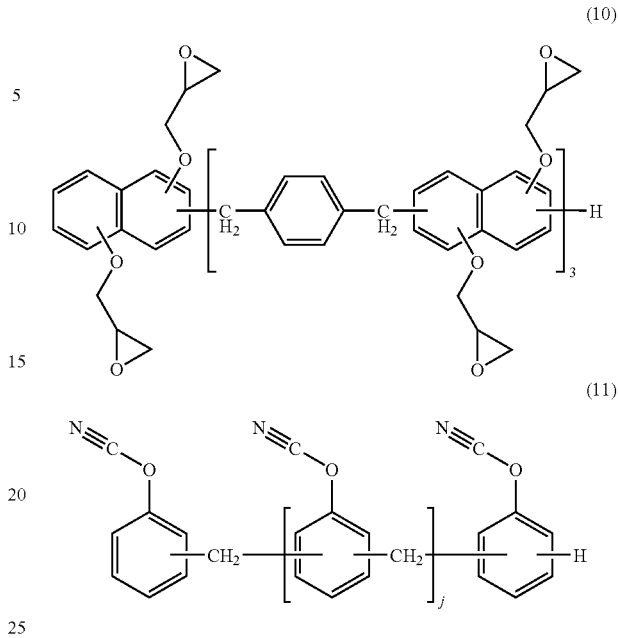

Example 1-8

The following components were prepared.

As the epoxy resin, an epoxy resin (A-3) primarily containing a compound represented by the formula (1);

as the curing agent, a curing agent (B-1) primarily containing a compound represented by the formula (4);

as the compound having at least two cyanate groups per molecule, a novolac type cyanate resin (C-1) represented by the formula (9);

as the curing accelerator, a curing accelerator (H-1), which is an assembly of molecules of a tetra-substituted phosphonium and a phenolic compound, as represented by the general formula (7) and synthesized by the method described later;

as the inorganic filler, the aforementioned crystalline silica (D-1) and spherical molten silica (D-4);

as other additives, a mold-releasing agent: carnauba wax as mentioned above, colorant agent: carbon black as mentioned above, and the aforementioned coupling agent.

[Synthesis Example of Curing Accelerator (H)]

The structure of the curing accelerator (H) synthesized was confirmed by NMR, element analysis and neutralization titration (titration based on phosphonium phenoxide equivalent) performed by the following method. The curing accelerator (H) synthesized was reacted with an excessive amount of oxalic acid known in weight, in a methanol/water-based solvent. The amount of the remaining oxalic acid was determined by titration with an aqueous sodium hydroxide solution known in normality. In this way, the normality (N/g) per weight of the curing accelerator (H) was calculated. The reciprocal number of this value was the equivalent of phosphonium phenoxide.

[Curing Accelerator (H-1)]

To a 1 L separable flask with a stirrer, 75.0 g (0.3 mol) of BPS-N (primarily containing 4,4'-bisphenol S) manufactured by Nicca Chemical Co., Ltd. and 100 ml of methanol were placed. The mixture was stirred at room temperature to dissolve. While further stirring the mixture, a solution, which was previously prepared by dissolving 4.0 g (0.1 mol) of sodium hydroxide in 50 ml of methanol, was added and subsequently, a solution, which was previously prepared by dissolving 41.9 g (0.1 mol) of tetraphenyl phosphonium bromide in 150 mL of methanol, was added. The mixture was continuously stirred for a while, 300 mL of methanol was added thereto. Thereafter, the solution in the flask was added dropwise to a large amount of water with stirring to obtain a white precipitate. The precipitate was filtrated and dried to obtain a white crystal of 66.0 g. The white crystal was analyzed by NMR, mass spectrum, and element analysis. As a result, it was confirmed that the curing accelerator (H-1), which is a complex formed of tetraphenylphosphonium (1 molecule) and 4,4'-bisphenol S in a molar ratio of 1:1.5. Furthermore, based on the value of neutralization titration, the equivalent of a phosphonium phenoxide was obtained as 728 as a measurement value, which is close to a theoretical value of 713. From this, it was confirmed that the curing accelerator (H-1) has the structure represented by the general formula (7). The yield of synthesis was 92.6%.

in Example 1-1 were used except that the novolac cyanate resin (C-1) was not used and aluminum hydroxide (CL-303 manufactured by Sumitomo Chemical Co., Ltd.) was used as a flame retardant. The components were blended in accordance with the contents shown in Table 1. Comparative Examples 1-1 and 1-2, kneading was performed in the same manner as in Example 1-1 to prepare epoxy resin compositions, were subjected to evaluation.

Results

Good results with respect to warpage as well as flame retardancy were obtained in Examples 1-1 to 1-8. In Comparative Example 1-1, warpage was large and flame retardancy was insufficient. In Comparative Example 1-2 using aluminum hydroxide as a flame retardant, flame retardancy was ensured; however, warpage increased.

TABLE 1

| | Item | Example 1-1 | 1-2 | 1-3 | 1-4 | 1-5 | 1-6 | 1-7 | 1-8 | Comparative Example 1-1 | 1-2 |
|---|---|---|---|---|---|---|---|---|---|---|---|
| Compostition (parts by weight) | A-1 | 9.0 | | | | | 5.3 | 8.0 | | 12.0 | 12.0 |
| | A-2 | | 7.0 | | | | 3.7 | | | | |
| | A-3 | | | 8.0 | | | | | 2.0 | | |
| | A-4 | | | | 7.0 | | | | | | |
| | A-5 | | | | | 7.0 | | | | | |
| | B-1 | 4.5 | | | | 4.9 | 4.5 | 1.3 | 1.2 | 7.5 | 7.5 |
| | B-2 | | | 2.3 | | | | 1.0 | | | |
| | B-3 | | 5.1 | | | | | | | | |
| | B-4 | | | | 8.5 | | | | | | |
| | C-1 | 5.8 | | 8.0 | | | 5.8 | 8.0 | 14.0 | | |
| | C-2 | | 7.2 | | 3.8 | 7.4 | | | | | |
| | H-1 | | | | | | | | 0.1 | | |
| | D-1 | 80 | | | 80.0 | | 70.0 | | 50.0 | 80 | 70 |
| | D-2 | | 80.0 | | | | | | | | |
| | D-3 | | | 81.0 | | | | 81.0 | | | |
| | D-4 | | | | | 80.0 | 10.0 | | 32.0 | | |
| | Aluminum hydroxide | | | | | | | | | | 10 |
| | Imidazole | 0.15 | 0.15 | 0.15 | 0.15 | 0.15 | 0.15 | 0.15 | | 0.15 | 0.15 |
| | Cobalt acetylacetonato | 0.15 | 0.15 | 0.15 | 0.15 | 0.15 | 0.15 | 0.15 | | | |
| | Carnauba wax | 0.2 | 0.2 | 0.2 | 0.2 | 0.2 | 0.2 | 0.2 | 0.2 | 0.2 | 0.2 |
| | Carbon black | 0.1 | 0.1 | 0.1 | 0.1 | 0.1 | 0.1 | 0.1 | 0.3 | 0.1 | 0.1 |
| | Coupling agent (GPS-M) | 0.1 | 0.1 | 0.1 | 0.1 | 0.1 | 0.1 | 0.1 | 0.3 | 0.1 | 0.1 |
| | Total | 100.0 | 100.0 | 100.0 | 100.0 | 100.0 | 100.0 | 100.0 | 100.0 | 100.05 | 100.05 |
| Evaluation results | Spiral flow (cm) | 77 | 88 | 80 | 79 | 87 | 83 | 86 | 80 | 98 | 95 |
| | Glass transition temperature (Tg): °C. | 198 | 201 | 205 | 197 | 222 | 202 | 198 | 180 | 148 | 155 |
| | α1 (ppm/°C.) | 21 | 22 | 20 | 21 | 20 | 20 | 21 | 15 | 20 | 20 |
| | α2 (ppm/°C.) | 38 | 40 | 38 | 38 | 42 | 37 | 38 | 30 | 68 | 82 |
| | Warpage of package (determined after curing at 175°C. for 4 hours) | ○ | ○ | ○ | ○ | ○ | ○ | ○ | ○ | Δ | X |
| | Warpage of package (determined after curing at 200°C. for 4 hours) | ◎ | ◎ | ◎ | ◎ | ◎ | ◎ | ◎ | ◎ | Δ | X |
| | Solder crack resistance | 0/8 | 0/8 | 0/8 | 0/8 | 0/8 | 0/8 | 0/8 | 0/8 | 3/8 | 4/8 |
| | Thermal shock test | 0/10 | 0/10 | 0/10 | 0/10 | 0/10 | 0/10 | 0/10 | 0/10 | 4/10 | 5/10 |
| | Flame retardancy (UL test) | V-0 | V-0 | V-0 | V-0 | V-0 | V-0 | V-0 | V-0 | V-1 | V-0 |

In Example 1-8, the component except those used in Examples 1-1 to 1-7 was the curing accelerator (H-1). The components prepared above were blended in accordance with the contents shown in Table 1 and kneaded in the same manner as in Example 1-1 to prepare an epoxy resin composition, which was subjected to evaluation.

Comparative Examples 1-1 and 1-2

In Comparative Example 1-1, the same components as in Example 1-1 were used except that the cyanate resin was not used. In Comparative Example 1-2, the same components as In an epoxy resin composition according to the above embodiment, flame retardancy is maintained and excellent warpage suppression is obtained. The epoxy resin composition, since it is particularly excellent in thermal shock, is effectively used in area-mounted semiconductor devices installed in automobiles.

Next, an epoxy resin composition according to a second embodiment of the invention will be described in detail by way of examples, however, the embodiment is not limited to these. The units of contents are expressed in term of parts by weight.

Example 2-1

The following components were prepared:
as the epoxy resin, a biphenyl type epoxy resin (A-1) (YX 4000H manufactured by Japan Epoxy Resin Co., Ltd., melting point: 105° C., epoxy equivalent: 193) primarily containing a compound represented by the aforementioned formula (12);
as the compound having at least two cyanate groups per molecule, a novolac type cyanate resin (C-1) represented by the aforementioned formula (9) (CT-90 manufactured Lonza Group Ltd., melting point: 65° C., note that the number i of repeat units is 3 in average);
as the inorganic filler, crystalline silica (D-1) (average particle diameter: 42 μm, the content of particles having a diameter of 30 μm to 60 μm: 90.4 wt %);
as the flame retardant, zinc molybdate (F-1);
as the curing accelerator, bisphenol S (G-1) (manufactured by Shikoku Chemicals Corporation) and cobalt acetylacetonato (G-5) (manufactured by Kanto Chemical Co. Inc.);
as other additives, a mold-releasing agent: carnauba wax, a coloring agent: carbon black and a coupling agent (GPS-M manufactured by Chisso Corp.).

These components were blended in accordance with the contents shown below:

| | |
|---|---|
| Biphenyl type epoxy resin (A-1) | 9.2 parts by weight |
| Novolac type cyanate resin (C-1) | 10.0 parts by weight |
| Crystalline silica (D-1) | 75.0 parts by weight |
| zinc molybdate (F-1) | 5.0 parts by weight |
| curing accelerator (G-1) (bisphenol S) | 0.2 parts by weight |
| curing accelerator (G-5) (cobalt acetylacetonato) | 0.2 parts by weight |
| Mold-releasing agent (Carnauba wax) | 0.2 parts by weight |
| Coloring agent (Carbon black) | 0.1 parts by weight |
| Coupling agent (GPS-M) | 0.1 parts by weight |

Note that, the average particle diameter of crystalline silica (D-1) used herein was obtained by use of a laser diffraction type particle-size distribution measurement apparatus, SALD-7000 (laser wavelength: 405 nm) manufactured by Shimadzu Corporation.

The aforementioned components were blended at normal temperature by a mixer, kneaded by a heating roller at 70 to 120° C., cooled and then pulverized to obtain an epoxy resin composition. The epoxy resin composition thus obtained was evaluated by the following method. The evaluation results are shown in Table 2.

Evaluation Methods
1. Torque Ratio

Using a curastmeter (JSR curastmeter Type IVPS manufactured by Orientec Co., Ltd.), torque value was obtained at 90 seconds and at 300 seconds after initiation of heating under the conditions: the diameter of a dies: 35 mm, amplitude angle: 10, mold temperature: 175° C. Then, a torque ratio, that is, a value of (torque at 90 seconds after the initiation)/(torque at 300 seconds after the initiation), was calculated. The torque ratio obtained by the curastmeter was used as a parameter of the curing ability. The larger the torque ratio, the better the curing ability.

Examples 2-2 to 2-7

The components except those used in Example 2-1 were as follows:

As the epoxy resin,
a biphenyl aralkyl type epoxy resin (A-2) primarily containing a compound represented by the aforementioned formula (13) (NC-3000P manufactured by Nippon Kayaku Co., Ltd., softening point: 60° C., epoxy equivalent: 272),
an epoxy resin (A-3) primarily containing a compound represented by the aforementioned formula (1) (E-1032H60 manufactured by Japan Epoxy Resin Co., Ltd., a melting point: 56° C., epoxy equivalent: 171, note that the number a of repeat units is 0),
a naphthalene type tetrafunctional epoxy resin (A-4) (HP4770 manufactured by Dai Nippon Printing Co., Ltd., epoxy equivalent: 141) primarily containing a compound represented by the aforementioned formula (2), or
a naphthalene novolac type epoxy resin (A-5) (ESN-375 manufactured by Nippon Steel Chemical Co., Ltd., epoxy equivalent: 173) represented by the aforementioned formula (10);
as the compound having at least two cyanate groups per molecule, a cyanate resin (C-2) represented by the aforementioned formula (11) (PT-60 manufactured by Lonza Group Ltd., note that the number j of repeat units is 3 in average);
as the inorganic filler,
glass flakes (D-2) (RCF140A manufactured by Nippon Sheet Glass Company, Limited, aspect ratio: 28, average particle diameter: 45 μm), or
microwool (D-3), which consists of glass fiber, (CMLF109 manufactured by Nippon Sheet Glass Company, Limited, aspect ratio: 35, average particle diameter: 70 μm);
as the flame retardant, zinc borate (F-2); as the curing accelerator, bisphenol F (G-2) and acetylacetonato (G-4) (manufactured by Kanto Chemical Co. Inc.), cobalt naphthenate (G-3) (manufactured by Kanto Chemical Co. Inc.), ferrocene (G-6) (cyclopentadienyliron) (manufactured by Kanto Chemical Co. Inc.), and aluminum oxide (G-7) (manufactured by Kanto Chemical Co. Inc.).

These components were blended in accordance with the contents shown in Table 2 and kneaded in the same manner as in Example 2-1 to prepare epoxy resin compositions, which were subjected to evaluation.

Comparative Examples 2-1 and 2-2

In Comparative Example 2-1, the same components as in Example 1 were used except that the flame retardant was not used. In Comparative Example 2-2, the same components as in Example 2-1 were used except that the flame retardant was not used and spherical molten silica (D-4) (average particle diameter: 15 μm) was used. The components were blended in accordance with the contents shown in Table 2. Comparative Examples 2-1 and 2-2, kneading was performed in the same manner as in Example 2-1 to prepare epoxy resin compositions, were subjected to evaluation.

TABLE 2

| | Item | Example 2-1 | Example 2-2 | Example 2-3 | Example 2-4 | Example 2-5 | Example 2-6 | Example 2-7 | Comparative Example 2-1 | Comparative Example 2-2 |
|---|---|---|---|---|---|---|---|---|---|---|
| Composition (parts by weight) | A-1 | 9.2 | | | | | 9.0 | 7.2 | 9.2 | 9.2 |
| | A-2 | | 9.1 | | | | 6.1 | | | |
| | A-3 | | | 10.0 | | | | | | |

TABLE 2-continued

|  | Item | Example 2-1 | 2-2 | 2-3 | 2-4 | 2-5 | 2-6 | 2-7 | Comparative Example 2-1 | 2-2 |
|---|---|---|---|---|---|---|---|---|---|---|
|  | A-4 |  |  |  | 10.0 |  |  |  |  |  |
|  | A-5 |  |  |  |  | 7.0 |  |  |  |  |
|  | C-1 | 10.0 |  | 8.1 |  |  | 11.0 | 7.0 | 10.0 | 10.0 |
|  | C-2 |  | 9.8 |  | 7.2 | 8.2 |  |  |  |  |
|  | D-1 | 75.0 |  |  | 77.0 |  | 70.0 |  | 80.0 |  |
|  | D-2 |  | 76.0 |  |  | 80.0 |  | 80.0 |  |  |
|  | D-3 |  |  | 78.0 |  |  |  |  |  |  |
|  | D-4 |  |  |  |  |  |  |  |  | 80.0 |
|  | F-1 | 5.0 | 2.0 | 2.0 | 3.0 | 2.0 | 2.0 |  |  |  |
|  | F-2 |  | 2.0 | 1.0 | 2.0 | 2.0 | 1.0 | 5.0 |  |  |
|  | G-1 | 0.2 |  | 0.2 |  | 0.2 | 0.2 |  | 0.2 | 0.2 |
|  | G-2 |  | 0.3 |  | 0.2 |  |  | 0.2 |  |  |
|  | G-3 |  |  |  | 0.2 |  |  |  |  |  |
|  | G-4 |  | 0.2 |  |  |  |  | 0.2 |  |  |
|  | G-5 | 0.2 |  |  |  | 0.2 |  |  | 0.2 | 0.2 |
|  | G-6 |  |  | 0.15 |  |  |  |  |  |  |
|  | G-7 |  |  |  |  |  | 0.15 |  |  |  |
|  | Imidazole |  | 0.15 | 0.15 |  |  | 0.15 |  |  |  |
|  | Carnauba wax | 0.2 | 0.2 | 0.2 | 0.2 | 0.2 | 0.2 | 0.2 | 0.2 | 0.2 |
|  | Carbon black | 0.1 | 0.1 | 0.1 | 0.1 | 0.1 | 0.1 | 0.1 | 0.1 | 0.1 |
|  | Coupling agent (GPS-M) | 0.1 | 0.1 | 0.1 | 0.1 | 0.1 | 0.1 | 0.1 | 0.1 | 0.1 |
| Evaluation results | Spiral flow (cm) | 80 | 90 | 82 | 83 | 90 | 86 | 90 | 84 | 95 |
|  | Torque rate | 75 | 80 | 83 | 78 | 72 | 78 | 80 | 79 | 60 |
|  | Glass transition temperature (Tg): °C. | 189 | 195 | 203 | 193 | 210 | 196 | 191 | 192 | 155 |
|  | α1 (ppm/°C.) | 20 | 21 | 21 | 22 | 21 | 21 | 20 | 20 | 20 |
|  | α2 (ppm/°C.) | 37 | 39 | 40 | 40 | 40 | 39 | 39 | 35 | 42 |
|  | Warpage of package (determined after curing at 175° C. for 4 hours) | ○ | ○ | ○ | ○ | ○ | ○ | ○ | ○ | ○ |
|  | Warpage of package (determined after curing at 200° C. for 4 hours) | ⊚ | ⊚ | ⊚ | ⊚ | ⊚ | ⊚ | ⊚ | ⊚ | ⊚ |
|  | Solder crack resistance | 0/8 | 0/8 | 0/8 | 0/8 | 0/8 | 0/8 | 0/8 | 0/8 | 0/8 |
|  | Thermal shock test | 0/10 | 0/10 | 0/10 | 0/10 | 0/10 | 0/10 | 0/10 | 0/10 | 0/10 |
|  | Flame retardancy (UL test) | V-0 | V-0 | V-0 | V-0 | V-0 | V-0 | V-0 | V-1 | V-1 |

In an epoxy resin composition according to the above embodiment as well as the first embodiment, flame retardancy is maintained and excellent warpage suppression is obtained. The epoxy resin composition, since it is particularly excellent in thermal shock, is effectively used in area-mounted semiconductor devices installed in automobiles.

Next, an epoxy resin composition according to a third embodiment of the invention will be described in detail by way of examples, however, the embodiment is not limited to these. The units of contents are expressed in term of parts by weight.

[Synthesis Example of Compound (E) Having at Least Two Benzoxazine Rings]

The compound (E) having at least two benzoxazine rings was synthesized in accordance with the method described in Polymer 40 (1999) pp. 1815-1822. The synthesis example will be described below; however, the synthesis method is not necessarily limited to the method, reaction temperature and reaction time described in the document.

[Compound (E-1) Having at Least Two Benzoxazine Rings]

To a flask of 0.5 L in volume, 71.7 g (0.77 mol) of aniline and 150 mL of dioxane were placed and the mixture was stirred to dissolve. Then, 37.3 g of a formaldehyde solution (a 36 to 38% aqueous solution) was added dropwise to be reacted at room temperature for 2 hours. Thereafter, 71.5 g (0.38 mol) of 4,4'-dihydroxybiphenyl was added to be reacted with stirring at 100 to 110° C. for 6 hours. After completion of the reaction, a precipitate was filtrated and dried in a vacuum drier at 95° C. for 8 hours to obtain 148 g of the compound (E-1) having at least two benzoxazine rings and represented by the formula (15) below.

[Compound (E-2) Having at Least Two Benzoxazine Rings]

The same procedure as in the synthesis of compound (E-1) having at least two benzoxazine rings was repeated except that 90 g (0.77 mol) of m-ethynylaniline was used in place of 71.7 g (0.77 mol) of aniline to obtain the compound (E-1) having at least two benzoxazine rings. Thus, 143 g of the compound (E-2) having at least two benzoxazine rings and represented by the formula (16) below is obtained.

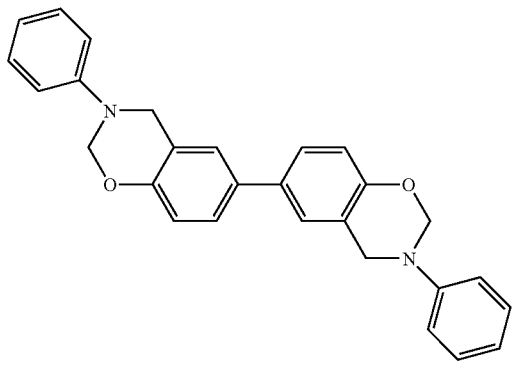

(15)

-continued (16)

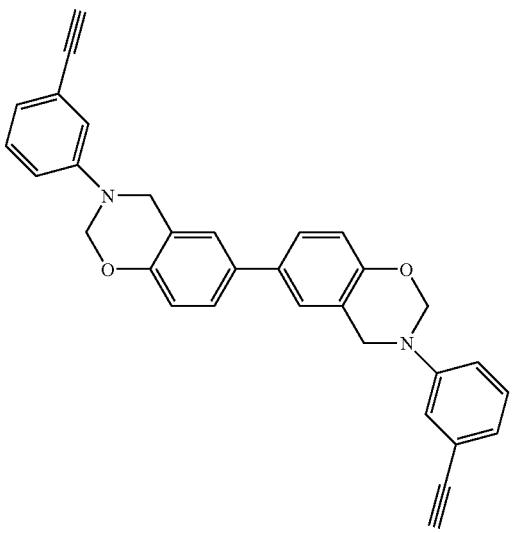

Example 3-1

The following components were prepared:

as the epoxy resin, a biphenyl type epoxy resin (A-1) (YX 4000H manufactured by Japan Epoxy Resin Co., Ltd., melting point: 105° C., epoxy equivalent: 193) primarily containing a compound represented by the aforementioned formula (12);

as the curing agent, a curing agent (B-1) primarily containing a component represented by the formula (4) (MEH7500 manufactured by Meiwa Plastic Industries, Ltd., softening point: 110° C., hydroxyl group equivalent: 97, note that the number c of repeat units is 0);

as the compound having at least two cyanate groups per molecule, a novolac type cyanate resin (C-1) represented by the aforementioned formula (9) (CT-90 manufactured Lonza Group Ltd., melting point: 65° C., note that the number i of repeat units is 3 in average);

the aforementioned compound (E-1) having at least two benzoxazine rings;

crystalline silica (D-1) (average particle diameter: 42 μm, the content of particles having a diameter of 30 μm to 60 μm: 90.4 wt %);

as a curing accelerator 1, imidazole (2 MPZ manufactured by Shikoku Chemicals Corporation);

as a curing accelerator 2, cobalt acetylacetonato (manufactured by Kanto Chemical Co. Inc.);

As other additives, a mold-releasing agent: carnauba wax, a coloring agent: carbon black and a coupling agent (GPS-M manufactured by Chisso Corp.).

These components were blended in accordance with the contents below:

| | |
|---|---|
| Biphenyl type epoxy resin (A-1) | 6.5 parts by weight |
| Curing agent (B-1) | 1.2 parts by weight |
| Novolac type cyanate resin (C-1) | 7.2 parts by weight |
| Compound (E-1) having at least two benzoxazine rings | 4.4 parts by weight |
| Crystalline silica (D-1) | 80.0 parts by weight |
| Curing accelerator 1 (imidazole) | 0.15 parts by weight |
| Curing accelerator 2 (cobalt acetylacetonato) | 0.15 parts by weight |
| Mold-releasing agent (Carnauba wax) | 0.2 parts by weight |
| Coloring agent (Carbon black) | 0.1 parts by weight |
| Coupling agent (GPS-M) | 0.1 parts by weight |

Note that, the average particle diameter of crystalline silica (D-1) used herein was obtained by use of a laser diffraction type particle-size distribution measurement apparatus, SALD-7000 (laser wavelength: 405 nm) manufactured by Shimadzu Corporation.

The aforementioned components were blended at normal temperature by a mixer, kneaded by a heating roller at 70° C. to 120° C., cooled and then pulverized to obtain an epoxy resin composition. The epoxy resin composition thus obtained was evaluated by the following method. The evaluation results are shown in Table 3.

Evaluation Methods

1. Water absorption: Test pieces of 50 mm in diameter and 3 mm in thickness were molded by a low-pressure transfer molding machine at a mold temperature of 175° C. and at a transfer pressure of $7.4 \times 10^6$ Pa, for curing time of 120 seconds. Then the test pieces were subjected to a post curing process in which heating was performed at 175° C. for 8 hours. Thereafter, the test pieces were subjected to a humidification process performed under the conditions: a temperature: 85° C., a relative humidity: 85%, for 168 hours. The weight change was determined before and after the humidification process. The unit used herein was % by weight.

2. Solder crack resistance: 8 packages molded and subjected to a post curing process (processed at 175° C. for 4 hours) for the package warpage amount measurement, were treated at 85° C., a relative humidity of 85%, for 168 hours and then subjected to an IR reflow treatment performed at a peak temperature 235° C. of the JEDEC conditions. After the treatment, the presence or absence of removal and crack within each of the packages was observed by an ultrasonic flaw detector. The number of defective packages were counted. The ratio of defective packages n to 8 packages was indicated as n/8.

Note that spiral flow, glass transition temperature (Tg), values of linear expansion coefficients α1 and α2, amount of package warpage, thermal shock test and flame retardancy were checked in the same conditions as in Example 1-1.

Examples 3-2 to 3-7

The components except those used in Example 3-1 were as follows:

As the epoxy resin, a biphenyl aralkyl type epoxy resin (A-2) primarily containing a compound represented by the aforementioned formula (13) (NC-3000P manufactured by Nippon Kayaku Co., Ltd., softening point: 60° C., epoxy equivalent: 272, note that the number k of repeating units is 3 in average), an epoxy resin (A-3) primarily containing a compound represented by the aforementioned formula (1) (E-1032H60 manufactured by Japan Epoxy Resin Co., Ltd., a melting point: 56° C., epoxy equivalent: 171, note that the number a of repeat units is 0), a naphthalene type tetrafunctional epoxy resin (A-4) (HP4770 manufactured by Dai Nippon Printing Co., Ltd., epoxy equivalent: 141) primarily containing a compound represented by the aforementioned formula (2), or a naphthalene novolac type epoxy resin (A-5) (ESN-375 manufactured by Nippon Steel Chemical Co., Ltd., epoxy equivalent: 173) represented by the aforementioned formula (10);

as the curing agent, a curing agent (B-2) primarily containing a component represented by the formula (14) (pararosaniline (base) manufactured by Kanto Chemical Co. Inc., $NH_2$ equivalent: 101), a phenol aralkyl resin (B-3) primarily containing a compound represented by the formula (5) (XL-225 manufactured by Mitsui Chemicals, Inc., hydroxyl group equivalent: 172, softening point: 77° C., note that the number d of repeat units is 3 in average), or a biphenyl aralkyl type phenolic resin (B-4) primarily containing a compound represented by the formula (6) (MEH-7851ss manufactured by Meiwa Plastic Industries, Ltd., hydroxyl group equivalent: 199, softening point: 68° C., note that the number e of repeat units is 3 in average);

as the compound having at least two cyanate groups per molecule, a cyanate resin (C-2) represented by the formula (11) below (PT-60 manufactured by Lonza Group Ltd., note that the number j of repeat units is 3 in average);

the compound (E-2) having at least two benzoxazine rings;

as the inorganic filler, glass flakes (D-2) (RCF140A manufactured by Nippon Sheet Glass Company, Limited, aspect ratio: 28, average particle diameter: 45 μm), microwool (D-3), which consists of glass fiber, (CMLF109 manufactured by Nippon Sheet Glass Company, Limited, aspect ration: 35, average particle diameter: 70 μm), or spherical molten silica (D-4) (average particle diameter: 15 μm);

as the flame retardant, zinc molybdate (F-1) (having an average particle diameter of 18 μm, manufactured by Sherwin-Williams Company in Japan), and zinc borate (F-2) (having an average particle diameter of 7 μm, manufactured by BORAX).

These components were blended in accordance with the contents shown in Table 3 and kneaded in the same manner as in Example 3-1 to prepare epoxy resin compositions, which were subjected to evaluation.

Comparative Examples 3-1 to 3-3

In Comparative Example 3-1, the same components as in Example 3-1 were used except that the novolac type cyanate resin (C-1), the compound (E-1) having at least two benzoxazine rings and cobalt acetylacetonato were not used. In Comparative Example 3-2, the same components as in Example 3-1 were used except that the novolac type cyanate resin (C-1), the compound (E-1) having at least two benzoxazine rings and cobalt acetylacetonato were not used and aluminum hydroxide (CL-303 manufactured by Sumitomo Chemical Co., Ltd.) was used as a flame retardant. In Comparative Example 3-3, the same components as in Example 3-1 were used except that the compound (E-1) having at least two benzoxazine rings was not used. The components were blended in accordance with the contents shown in Table 3. Comparative Examples 3-1 to 3-3, kneading was performed in the same manner as in Example 3-1 to prepare epoxy resin compositions, were subjected to evaluation.

Results

Good results with respect to warpage as well as flame retardancy were obtained in Examples 3-1 to 3-8. In Comparative Example 3-1, warpage was large and flame retardancy was insufficient. In Comparative Example 3-2 using aluminum hydroxide as a flame retardant, flame retardancy was ensured; however, warpage increased.

TABLE 3

| | Item | Example | | | | | | | | Comparative Example | | |
|---|---|---|---|---|---|---|---|---|---|---|---|---|
| | | 3-1 | 3-2 | 3-3 | 3-4 | 3-5 | 3-6 | 3-7 | 3-8 | 3-1 | 3-2 | 3-3 |
| Composition (parts by weight) | A-1 | 6.5 | | | | | 4.0 | 7.2 | 6.5 | 12.0 | 12.0 | 2.0 |
| | A-2 | | 7.0 | | | | 2.7 | | | | | |
| | A-3 | | | 7.0 | | | | | | | | |
| | A-4 | | | | 5.7 | | | | | | | |
| | A-5 | | | | | 7.6 | | | | | | |
| | B-1 | 1.2 | | | 2.0 | 0.5 | 1.0 | 1.2 | | 7.4 | 7.4 | 1.0 |
| | B-2 | | | 0.9 | | | | 0.7 | | | | |
| | B-3 | | 0.8 | | | | | | | | | |
| | B-4 | | | | 3.8 | | | | | | | |
| | C-1 | 7.2 | | 5.6 | | | 6.1 | 6.4 | 7.2 | | | 16.3 |
| | C-2 | | 6.5 | | 4.8 | 4.2 | | | | | | |
| | E-1 | 4.4 | | 4.8 | | | | | 4.4 | | | |
| | E-2 | | 5.0 | | 5.0 | 5.5 | 6.0 | 3.0 | | | | |
| | D-1 | 80.0 | | | 80.0 | | 70.0 | | 74.0 | 80.0 | 70.0 | 70.0 |
| | D-2 | | 80.0 | | | | | | | | | |
| | D-3 | | | 81.0 | | | | 81.0 | | | | |
| | D-4 | | | | | 80.0 | 10.0 | | | | | |
| | F-1 | | | | | | | | 3.0 | | | |
| | F-2 | | | | | | | | 3.0 | | | |
| | Aluminum hydroxide | | | | | | | | | | 10.0 | 10.0 |
| | Imidazole | 0.15 | 0.15 | 0.15 | 0.15 | 0.15 | 0.15 | 0.15 | 0.15 | 0.15 | 0.15 | 0.15 |
| | Cobalt acetylacetonato | 0.15 | 0.15 | 0.15 | 0.15 | 0.15 | 0.15 | 0.15 | 0.15 | | | 0.15 |
| | Carnauba wax | 0.2 | 0.2 | 0.2 | 0.2 | 0.2 | 0.2 | 0.2 | 0.2 | 0.2 | 0.2 | 0.2 |
| | Carbon black | 0.1 | 0.1 | 0.1 | 0.1 | 0.1 | 0.1 | 0.1 | 0.1 | 0.1 | 0.1 | 0.1 |
| | Coupling agent (GPS-M) | 0.1 | 0.1 | 0.1 | 0.1 | 0.1 | 0.1 | 0.1 | 0.1 | 0.1 | 0.1 | 0.1 |

TABLE 3-continued

|  | Item | Example 3-1 | Example 3-2 | Example 3-3 | Example 3-4 | Example 3-5 | Example 3-6 | Example 3-7 | Example 3-8 | Comparative Example 3-1 | Comparative Example 3-2 | Comparative Example 3-3 |
|---|---|---|---|---|---|---|---|---|---|---|---|---|
| Evalutation results | Spiral flow (cm) | 78 | 90 | 82 | 81 | 85 | 87 | 82 | 94 | 98 | 95 | 95 |
|  | Glass transition temperature (Tg): °C. | 238 | 235 | 240 | 237 | 239 | 242 | 241 | 235 | 148 | 155 | 215 |
|  | α1 (ppm/°C.) | 21 | 22 | 20 | 21 | 20 | 20 | 21 | 21 | 20 | 20 | 20 |
|  | α2 (ppm/°C.) | 40 | 42 | 41 | 40 | 41 | 43 | 42 | 43 | 68 | 82 | 82 |
|  | Water absorption (%) | 0.12 | 0.13 | 0.13 | 0.11 | 0.13 | 0.12 | 0.11 | 0.13 | 0.42 | 0.45 | 0.32 |
|  | Warpage of package (determined after curing at 175° C. for 4 hours) | ○ | ○ | ○ | ○ | ○ | ○ | ○ | ○ | Δ | X | ○ |
|  | Warpage of package (determined after curing at 200° C. for 4 hours) | ◎ | ◎ | ◎ | ◎ | ◎ | ◎ | ◎ | ◎ | Δ | X | ○ |
|  | Solder crack resistance | 0/8 | 0/8 | 0/8 | 0/8 | 0/8 | 0/8 | 0/8 | 0/8 | 7/8 | 7/8 | 3/8 |
|  | Thermal shock test | 0/10 | 0/10 | 0/10 | 0/10 | 0/10 | 0/10 | 0/10 | 0/10 | 4/10 | 5/10 | 0/10 |
|  | Flame retardancy (UL test) | V-0 | V-0 | V-0 | V-0 | V-0 | V-0 | V-0 | V-0 | V-1 | V-0 | V-0 |

In an epoxy resin composition according to the above embodiment as well as the first and second embodiments, flame retardancy is maintained and excellent warpage suppression is obtained. The epoxy resin composition, since it is particularly excellent in thermal shock, is effectively used in area-mounted semiconductor devices installed in automobiles.

The invention claimed is:

1. An epoxy resin composition comprising;
   at least one type of epoxy resin (A) selected from a first epoxy resin represented by the following formula (1), a second epoxy resin represented by the following formula (2), a third epoxy resin represented by the following formula (12), a fourth epoxy resin represented by the following formula (13), and a fifth epoxy resin represented by the following formula (10);
   a compound (C) having at least two cyanate groups per molecule; and
   an inorganic filler (D),
   the epoxy resin composition being with pulverized for sealing a semiconductor element, and being used in an area-mounted semiconductor device, to be molded by at least one molding method selected from transfer mold, compression mold, and injection mold,
   wherein the epoxy resin composition is free from aluminum hydroxide,

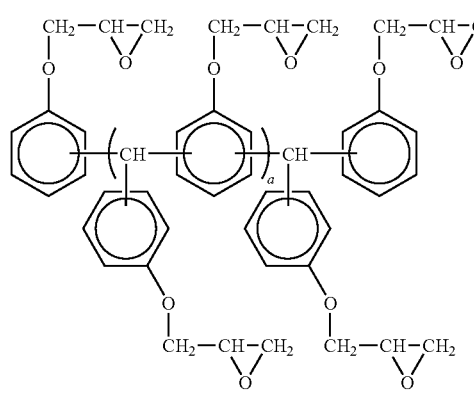

(1)

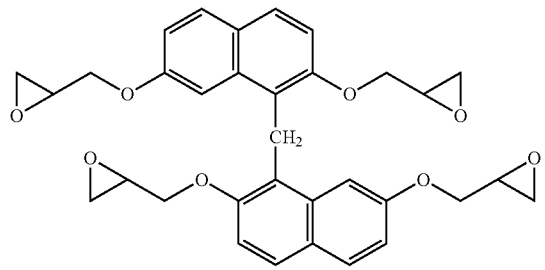

(2)

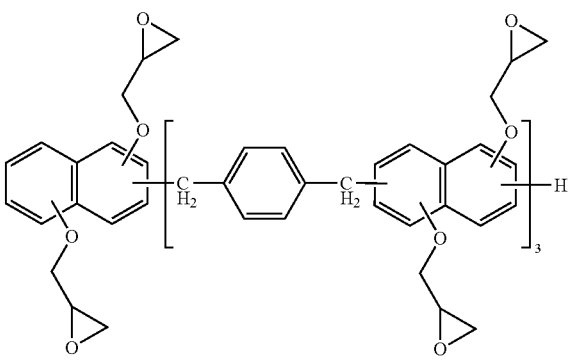

(10)

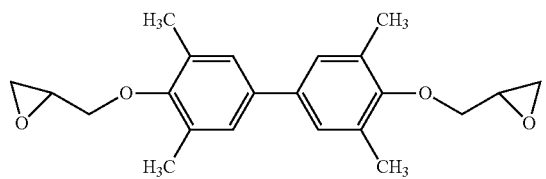

(12)

wherein a represents 0 to 10, (13)

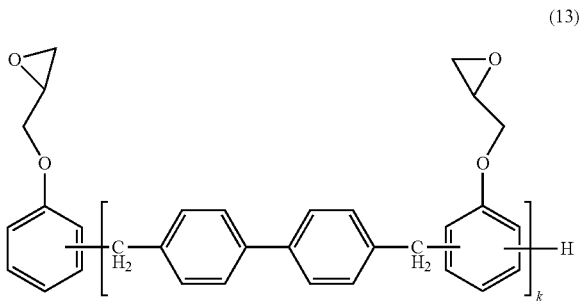

wherein k represents 2 to 10.

2. The epoxy resin composition according to claim 1, characterized in that said compound (C) having at least two cyanate groups per molecule is represented by the following general formula (3):

(3)

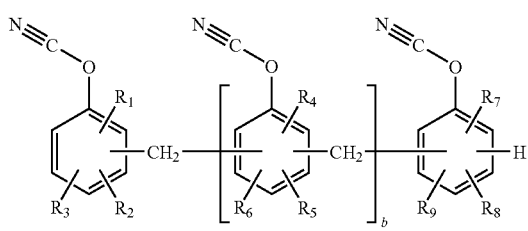

where, $R_1$ to $R_9$ each represent one type of element selected from a hydrogen atom, a methyl group, an ethyl group, a propyl group, a butyl group, a hydroxyl group, an amino group, phthalic acid, phthalic anhydride and a phenyl group and may be the same or different to each other; and b represents 0 to 10.

3. The epoxy resin composition according to claim 1, characterized in that said inorganic filler (D) is crystalline silica and/or glass flakes.

4. The epoxy resin composition according to claim 3, characterized in that said glass flakes have an aspect ratio of 10 to 40.

5. The epoxy resin composition according to claim 1 characterized in that the content of said inorganic filler (D) is 65 wt % to 85 wt % of the epoxy resin composition.

6. The epoxy resin composition according to claim 1 characterized by further comprising a flame retardant (F).

7. The epoxy resin composition according to claim 6 characterized in that said flame retardant (F) is at least one type of compound selected from zinc molybdate and zinc borate.

8. The epoxy resin composition according to claim 6 characterized in that the content of said inorganic filler (D) and said flame retardant (F) is 65 wt % to 85 wt % of the epoxy resin composition.

9. The epoxy resin composition according to claim 6 characterized by further comprising a curing accelerator (G) having at least one type of compound selected from a compound having a phenolic hydroxyl group, a metal complex and a metal oxide.

10. The epoxy resin composition according to claim 9 characterized in that said compound having a phenolic hydroxyl group is bisphenol A, bisphenol F or bisphenol S.

11. The epoxy resin composition according to claim 9 characterized in that the metal atom of said metal complex and said metal oxide is Mn, Fe, Co, Ni, Cu, Zn, Al or Sn.

12. The epoxy resin composition according to claim 9 characterized in that said metal complex is a naphthenic acid complex, an octylic acid complex, an acetylacetonato complex or a cyclopentadienyl complex.

13. The epoxy resin composition according to claim 1 characterized by further comprising a curing accelerator (H) represented by the following general formula (7):

(7)

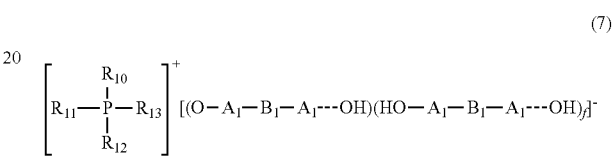

where P represents a phosphorus atom; $R_{10}$, $R_{11}$ $R_{12}$ and $R_{13}$ may be a substituted or unsubstituted aromatic group or an alkyl group; $A_1$ is an aromatic group, $B_1$ is a single bond or a divalent substituent selected from an ether group, sulfone group, sulfide group and carbonyl group, or a divalent organic group having 1 to 13 carbon atoms; and f is 0<f<1.

14. An area-mounted semiconductor device having a substrate having the surfaces one of which a semiconductor element is mounted and only the one of which is substantially sealed with an epoxy resin composition, characterized in that the epoxy resin composition is the epoxy resin composition according to claim 1 and further cured at 190° C. to 230° C. after the area-mounted semiconductor device is molded.

15. The epoxy resin composition according to claim 1 characterized by further comprising at least one type of compound selected from zinc molybdate and zinc borate, as a flame retardant (F).

16. The epoxy resin composition according to claim 1 further comprising a curing agent (B) having at least two groups capable of reacting with epoxy groups per molecule.

17. The epoxy resin composition according to claim 1 characterized by further comprising a compound (E) having at least two benzoxazine rings.

18. The epoxy resin composition according to claim 17 characterized in that said compound (E) having at least two benzoxazine rings has at least two carbon-carbon triple bonds per molecule.

19. The epoxy resin composition according to claim 1 characterized in that the value of a linear expansion coefficient α2 at a temperature of a glass transition temperature or more is not more than 2 fold as large as the value of the linear expansion coefficient α1 at a temperature of less than the glass transition temperature.

20. The epoxy resin composition according to claim 16 characterized in that said curing agent (B) having at least two hydroxyl groups per molecule is represented by the following formulas (4), (14), (5) and/or (6):

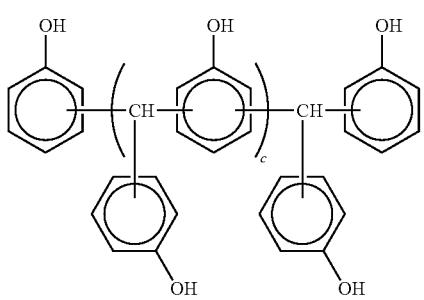
wherein c is 0 to 10,
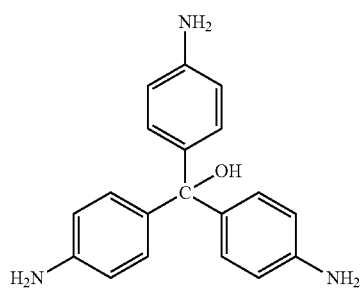
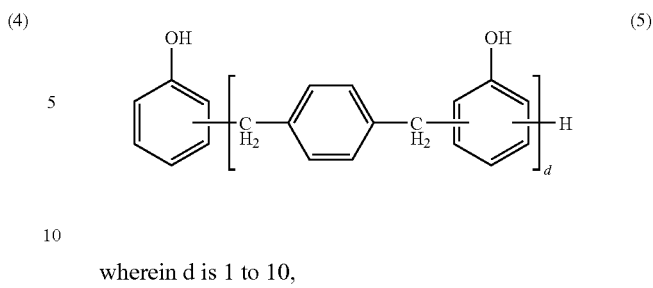
wherein d is 1 to 10,
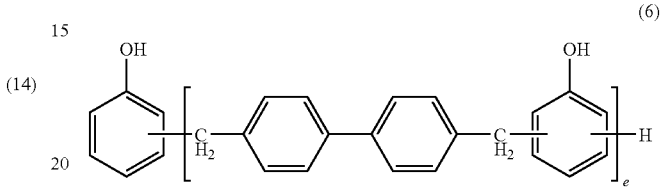
wherein e is 1 to 10.
21. The epoxy resin composition according to claim 15 characterized in that the content of said inorganic filler (D) and said flame retardant (F) is 65 wt % to 85 wt % of the epoxy resin composition.
* * * * *